United States Patent

Yun et al.

[11] Patent Number: 5,914,641
[45] Date of Patent: Jun. 22, 1999

[54] GATE VOLTAGE CONTROL CIRCUIT OF A POWER AMPLIFIER

[75] Inventors: Kwang-Jun Yun; Chang-Seok Lee; Seong-Jae Maeng; Jae-Jin Lee, all of Daeion-Shi, Rep. of Korea

[73] Assignee: Electronics and Telecommunications Research Institute, Daejeon, Rep. of Korea

[21] Appl. No.: 08/907,480

[22] Filed: Aug. 11, 1997

[30] Foreign Application Priority Data

Aug. 9, 1996 [KR] Rep. of Korea ............... 96-33177

[51] Int. Cl.⁶ ............... H03F 3/191; H03G 3/30
[52] U.S. Cl. ............... 330/302; 330/285
[58] Field of Search ............... 330/277, 285, 330/296, 302

[56] References Cited

U.S. PATENT DOCUMENTS

| | | | |
|---|---|---|---|
| 5,051,706 | 9/1991 | Zushi | 330/306 |
| 5,250,912 | 10/1993 | Fujita | 330/285 |
| 5,455,968 | 10/1995 | Pham | 330/285 |
| 5,532,646 | 7/1996 | Aihara | 330/285 |

FOREIGN PATENT DOCUMENTS

| | | |
|---|---|---|
| 0561346 | 9/1993 | European Pat. Off. . |
| 405308233 | 11/1993 | Japan ............... 330/302 |

*Primary Examiner*—Robert Pascal
*Assistant Examiner*—Khanh Van Nguyen
*Attorney, Agent, or Firm*—Antonelli, Terry, Stout & Kraus, LLP

[57] ABSTRACT

A gate voltage control circuit of a power amplifier for reducing the power dissipation by improving the efficiency at an average output power and for enhancing the linearity of the power amplifier at a maximum output power, the gate voltage control circuit comprising an input terminal for receiving an output power signal from a power amplifier; an output power detecting circuit for detecting the output power signal and for converting the detected output power signal to a DC voltage signal; a voltage dividing circuit comprising at least two resistors for dividing a voltage difference between the DC voltage signal and a negative voltage in a ratio of resistances of the resistors; and an output terminal for supplying the divided voltage as a gate voltage control signal.

6 Claims, 5 Drawing Sheets

GATE VOLTAGE CONTROL CIRCUIT OF A POWER AMPLIFIER

BACKGROUND OF THE INVENTION

1. Field of the Invention

The present invention generally relates to a gate-voltage control circuit, and more particularly to a gate voltage control circuit of a power amplifier which can improve the linearity and the efficiency of the power amplifier suitable for use in a digital mobile terminal.

2. Description of the Related Arts

In general, the efficiency and the linearity of power amplifiers are varied in contrary manners in accordance with the magnitudes of gate voltages. Thus, if the power amplifier is designed to be a class B power amplifier in which the gate voltage is applied with reduced toward a pinch-off voltage, the efficiency is increased while the linearity of the amplifier becomes poor. On the other hand, if the power amplifier is designed as a class A power amplifier in which the gate voltage is set for the operating Q point to be 50 percent of a saturation drain current Idss, the linearity of the power amplifier is improved, but the efficiency of the power amplifier is degraded. Because of these inherent characteristics of the power amplifier, when the gate voltage is made to be constant as in the conventional power amplifiers, it is impossible to control both the efficiency and the linearity depending on the magnitude of the output power. The conventional power amplifier represents more linearity than is needed and poor efficiency in low output power mode, whereas in the maximum output power, the power amplifier has good efficiency and poor linearity, resulting in the third-order intermodulation distortion IMD3 greater than −30 dBc. Therefore, this conventional amplifier is not suitable for use in digital devices which require a linearity of less than 30 dBc.

In a total DC power $P_{DC}$ supplied to a power amplifier, a dissipation power Pdiss consumed by a power FET (Field Effect Transistor) can be obtained by the following three equations.

$$P_{DC}(W) = Pdiss + (Pout - Pin) \quad (1)$$

$$PAE(\%) = [(Pour - Pin)/P_{DC}] * 100 \quad (2)$$

$$Pdiss(W) = P_{DC} - (Pout - Pin) = (Pout - Pin)(100/PAT - 1) \quad (3)$$

where, Pin is an input power, Pout is an output power, and PAE represents the efficiency.

By using the above equations (1) to (3), the dissipation power Pdiss consumed by the power FET in a power amplifier designed in a constant gate voltage applying type can be obtained as shown in FIG. 1. FIG. 1 is a diagram for showing the operating characteristics of a conventional power amplifier with the constant gate voltage applied such as the efficiency of the power amplifier and the dissipation power Pdiss of the power FET with respect to the output power.

When a supply voltage of 3.6 V is applied in a transmission frequency band ranged from 1750 to 1780 MHZ of a personal communication service (PCS), the power dissipation becomes minimum at a saturation output power region where the efficiency is at a maximum point. When the output power is lowered, the efficiency is rapidly reduced and the power dissipation is increased. The increase of the power consumption causes the power FET to be hot and, in the worst case the power FET may break down. Therefore, it is important, when the output power is lowered, to make the power dissipation have a value smaller than the saturation value by raising the efficiency of the power amplifier.

As explained so far, when the conventional power amplifier is used as a mobile telephone in a personal communication service using code divisional multiple access (CDMA) technique, the linearity of the output power to the input power and the efficiency of the power amplifier are required to be improved. Research has been conducted on feedforward, predistortion and feedback,and the results are published for improving the linearity of the power amplifier. However, these methods include complicated circuit structures which are suitable for only base stations. Accordingly, in the mobile station, simple linearity circuits most be developed. Further, because the efficiency of the power amplifier is improved according to the increase of the output power of the amplifier, most research has focused on improving maximum efficiency. As a result, the efficiency becomes poor in low output power, though the efficiency is sufficient near the saturation output power. The poor efficiency of the power amplifier in the low output power can increase the power dissipation of the power FET in proportion to the decreasing of the output power, which may cause thermal problems. On the other hand, because the power amplifier is normally operated in an average power level about 10 dB below the maximum output power, it is important to improve the efficiency at the average output power in order to lengthen the life of a battery used in the mobile station.

SUMMARY OF THE INVENTION

In light of the above description, it is an object of the present invention to provide a gate voltage control circuit of a power amplifier, which can improve the linearity of the output power to the input power at the maximum output power region and curtail the power consumption by improving the efficiency of the power amplifier at the average output power region where the power amplifier is usually operated.

The gate voltage control circuit of the present invention detects the output power so that the gate voltage can be reduced when the output power decreases, while the gate voltage can be increased when the output power increases.

According to a significant aspect of the present invention, the gate voltage control circuit comprises an input terminal for receiving an output power signal from a power amplifier; an output power detecting circuit for detecting the output power signal and for converting the detected output power signal to a DC voltage signal; a voltage dividing circuit comprising at least two resistors for dividing a voltage difference between the DC voltage signal and a negative voltage in a ratio of resistances of the resistors; and an output terminal for supplying the divided voltage as a gate voltage control signal.

The gate voltage control circuit of the present invention is suitable for use in a power amplifier which comprises a first power amplifying unit for receiving a constant gate voltage from an input matching circuit; a gate voltage control circuit for detecting an output power of an output matching circuit and for converting the detected output power to a gate voltage; a second power amplifying unit for receiving the gate voltage of the gate voltage control circuit; and an intermediate matching circuit for matching the first power amplifying unit and the second power amplifying unit.

BRIEF DESCRIPTION OF THE DRAWINGS

With the above and additional objects and advantages in mind as will hereinafter appear, the invention will be described with reference to the accompanying drawings, in which.

DETAILED DESCRIPTION OF THE PREFERRED EMBODIMENTS

Now the embodiments of the present invention will be explained in detail with reference to the accompanying drawings.

Figure 1:
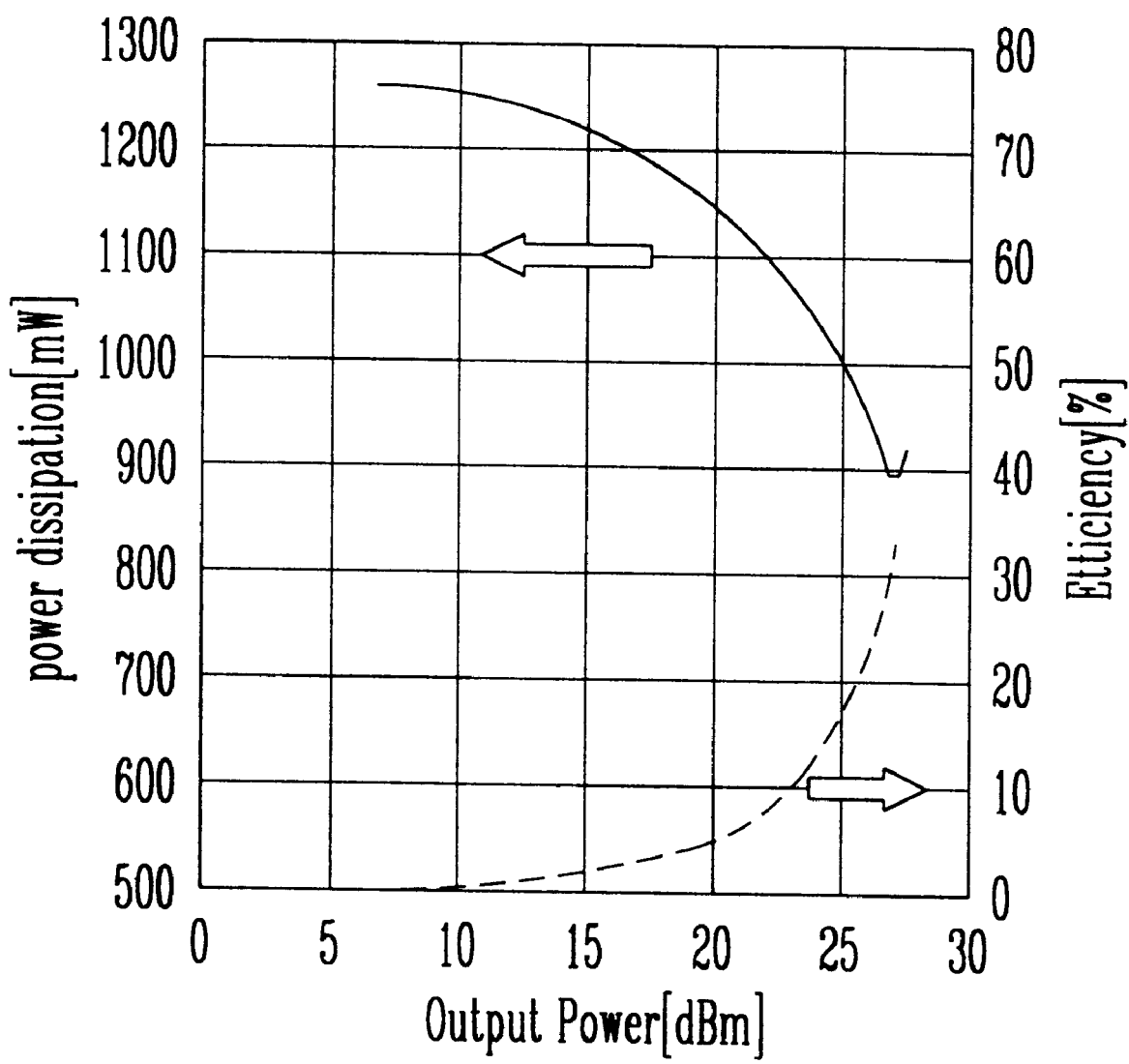
FIG. 1 is a characteristic diagram for showing the power dissipation Pdiss of a power field effect transistor versus the efficiency of a conventional power amplifier which is designed by a constant gate voltage applying technique.
Figure 2:
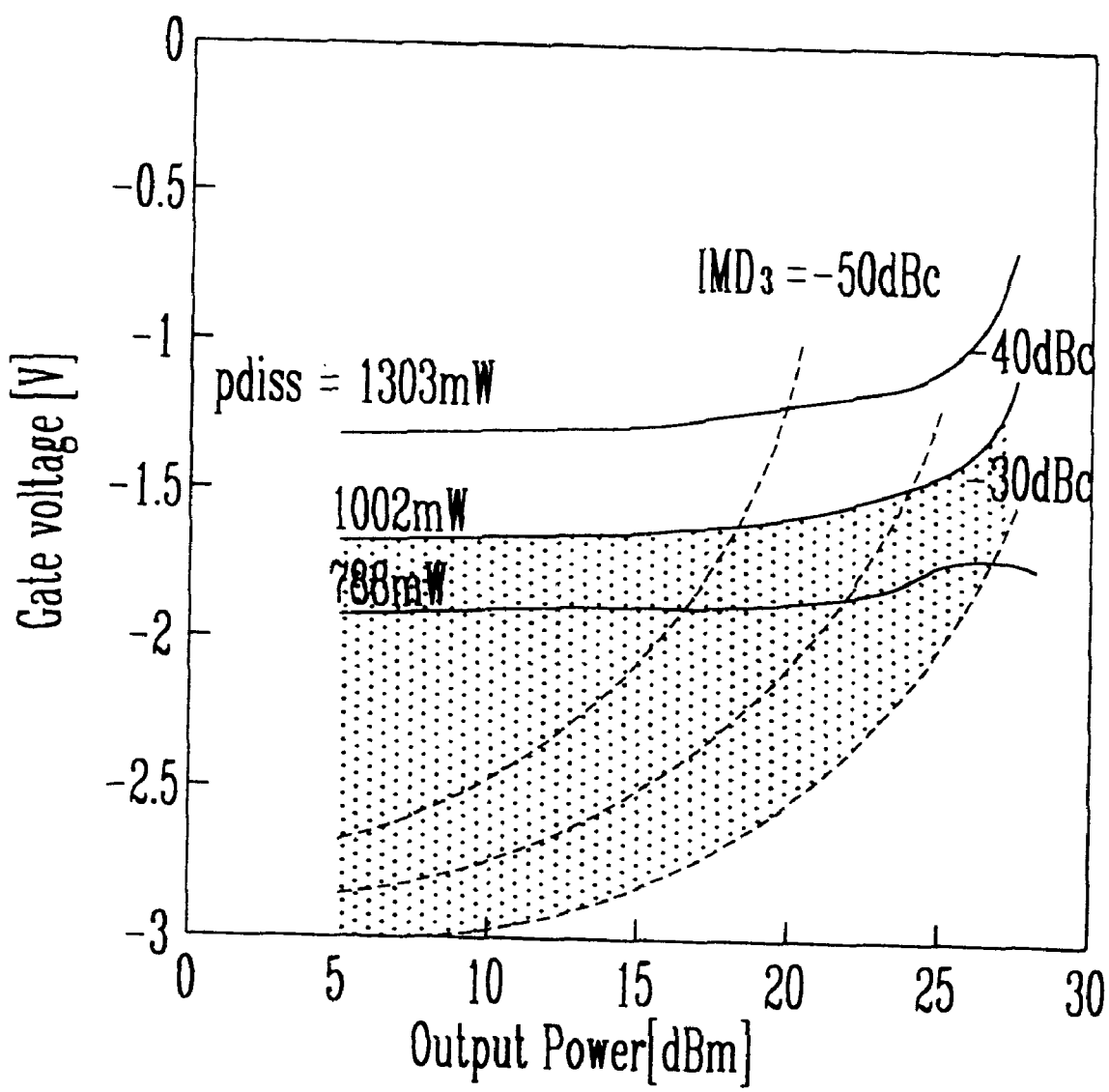
FIG. 2 is a characteristic diagram for showing a constant power dissipation and the third order intermodulation distortion IMD3 versus the output power of a power amplifier when the gate voltage of the power amplifier is varied from −3 V to −0.5 V.

FIG. 2 shows a constant output power curve and the third order intermodulation distortion curve IMD3 with respect to the output power when the gate voltage of the power amplifier is varied from −3 V to −0.5 V. From FIG. 2, it can be understood that when the output power is reduced for maintaining a constant power consumption Pdiss, the gate voltage should be accordingly decreased. For obtaining a constant third order intermodulation distortion IMD3, the gate voltage must be raised to a class A value contrary as in the case of power dissipation, when the output power is increased.

In FIG. 2, the curve of output power of 788 mW corresponds to a condition where output power is 27 dBm and the efficiency is 35 percent. On the other hand, the curves of 1002 mW and 1303 mW represent the power dissipation characteristics when the efficiencies are 30 percent and 25 percent, respectively.

If a power amplifier is applied to CDMA personal communication services, a requirement for an efficiency of above 30 percent at the maximum output power 27 dBm and of an IMD3 of below −30 dBc must be met. This requirement is represented as a black region in FIG. 2. As a result, the specification of the power amplifier can be met only when the gate voltage is applied within this region.

Figure 3:
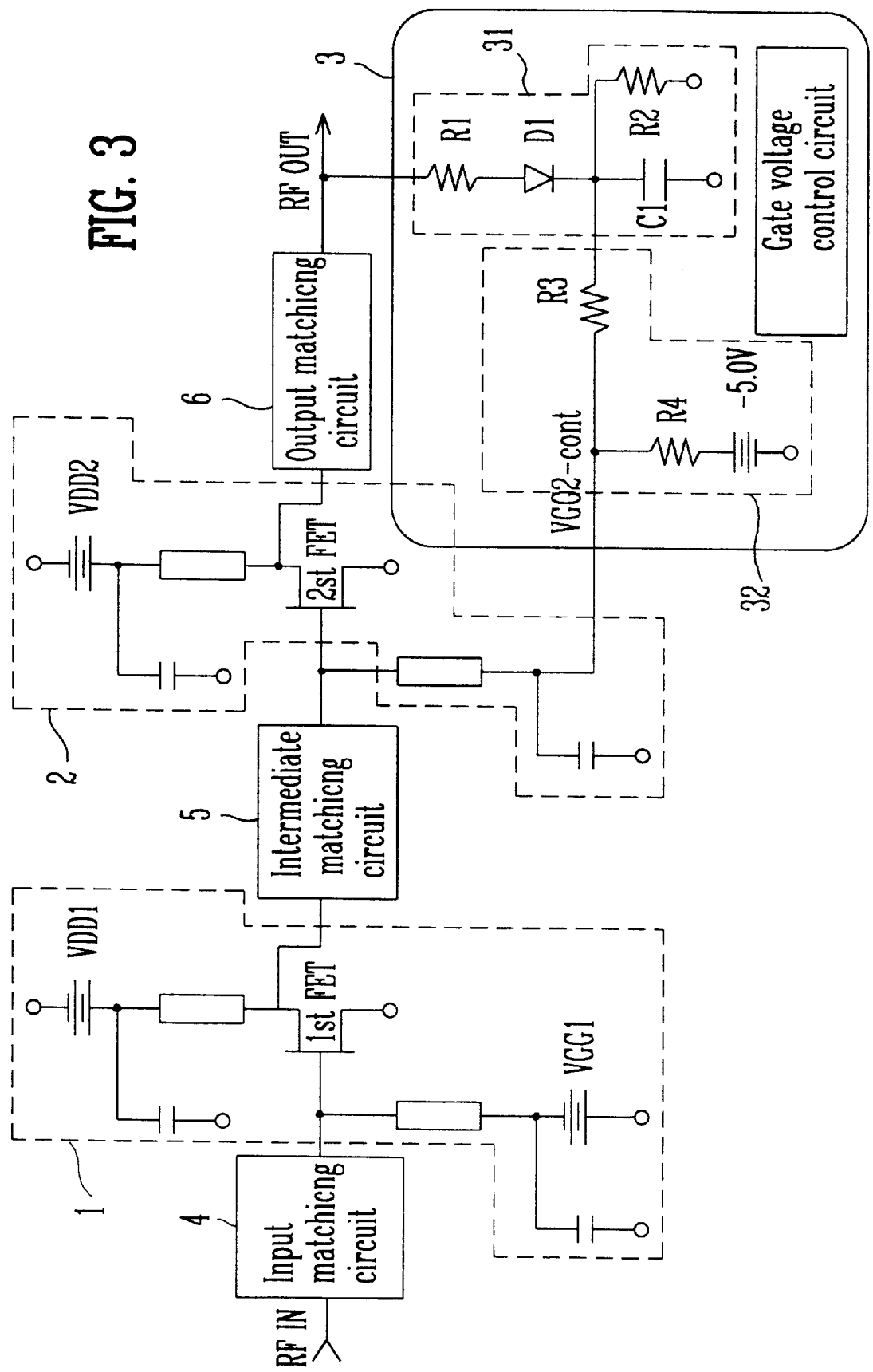
FIG. 3 is a circuit diagram of a power amplifier having two stage structure by using a gate voltage control circuit according to the present invention.

FIG. 3 shows a two-staged power amplifier designed by using a gate voltage control circuit of the present invention. The power amplifier comprises a first power amplifying unit 1, a second power amplifying unit 2, gate voltage controlling unit 3, an input matching circuit 4, intermediate matching circuit 5 and output matching circuit 6.

Through the input terminal of the input matching circuit 4 is supplied an RF(high frequency) signal. The input matching circuit 4 may have a transmission line connected between the RF input terminal and the gate electrode of the first FET. The input matching circuit 4 is provided to take an impedance matching of an input impedance of the first FET with an impedance of the RF input signal. Similarly, the output matching circuit 6 is provided to take impedance matching of an output impedance of the second FET with an impedance of the external circuit connected to the RF output terminal.

Because the first stage, i.e., the first power amplifying unit 1 has a relatively small power dissipation, a constant gate voltage is applied to the first power amplifying unit 1 through the input matching circuit 4. Whereas, since the power consumption of the second stage, i.e., the second power amplifying unit 2 is great, the output power of the output matching circuit 6 is applied to the second power amplifying unit 2 as the second stage gate voltage by detecting and feeding back the output power of the output matching circuit 6 by means of the gate voltage controlling unit 3. The first power FET of the first power amplifying unit 1 has a gate electrode connected to VGG1 through a load such as a transmission line. The gate of the first FET is also connected to the ground terminal through a capacitor. On the other hand, the drain of the first FET is connected to VDD1 and the ground terminal via a capacitor. The second power FET has a similar interconnection structure to the first FET except that the gate electrode of the second FET is >connected to the gate voltage controlling unit 3 via a transmission line.

The intermediate matching circuit 5 is connected between the first and the second power amplifying units 1 and 2 for impedance matching of the first and the second power FETs. The impedance matching of the intermediate matching circuit 5 can be accomplished by measuring the optimum efficiency and the optimum linearity using an automatic tuner measuring system.

The gate voltage control circuit 3 is so designed to meet the linearity of below −30 dBc at the dotted region of FIG. 2 and to provide a gate voltage which can minimize the power dissipation. The gate voltage control circuit 3 comprises an output power detecting circuit 31 and a voltage dividing circuit 32. The output power detecting circuit 31 includes a resistor R1 connected between the RF output terminal and a cathode of a diode D1, and the diode D1 has an anode which is commonly connected to a capacitor C1 and a resistor R2. The capacitor C1 and the resistor R2 have one end grounded. The output power detecting circuit 31 detects the output power and then converts the detected signal into a DC voltage signal. The voltage dividing circuit 32 divides the voltage difference between the charged voltage by the capacitor C1 and the negative supply voltage (−5 V) in a ratio of the resistance values of the resistors R3 and R4, and then supplies the divided voltage as a gate control voltage. The output power is charged in the capacitor C1 through the resistor R1 and the diode D1.

Figure 4:
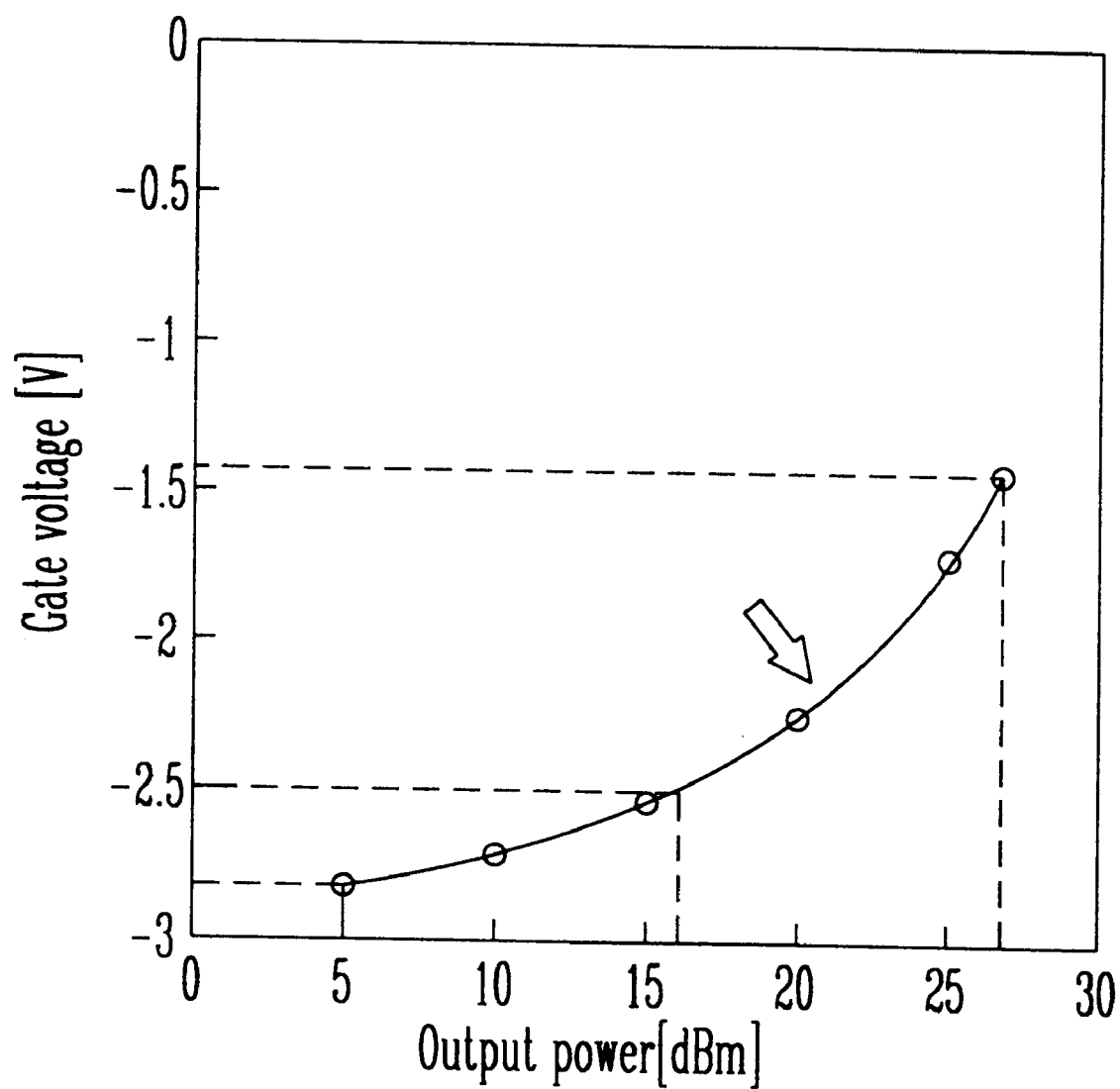
FIG. 4 is a characteristic diagram for showing a gate voltage curve versus an output power of the gate control circuit of the present invention.

FIG. 4 shows the gate voltage control characteristics of a gate voltage control circuit in accordance with the output power of a power amplifier. The gate control voltage Vg_cont has a value of −2.78 V, −2.71 V, −2.5 V, −2.26 V, and −1.38 V, when the output power is 5 dBm, 10 dBm, 16 dBm (average value), 20 dBm, and maximum 27 dBm, respectively.

Figure 5:
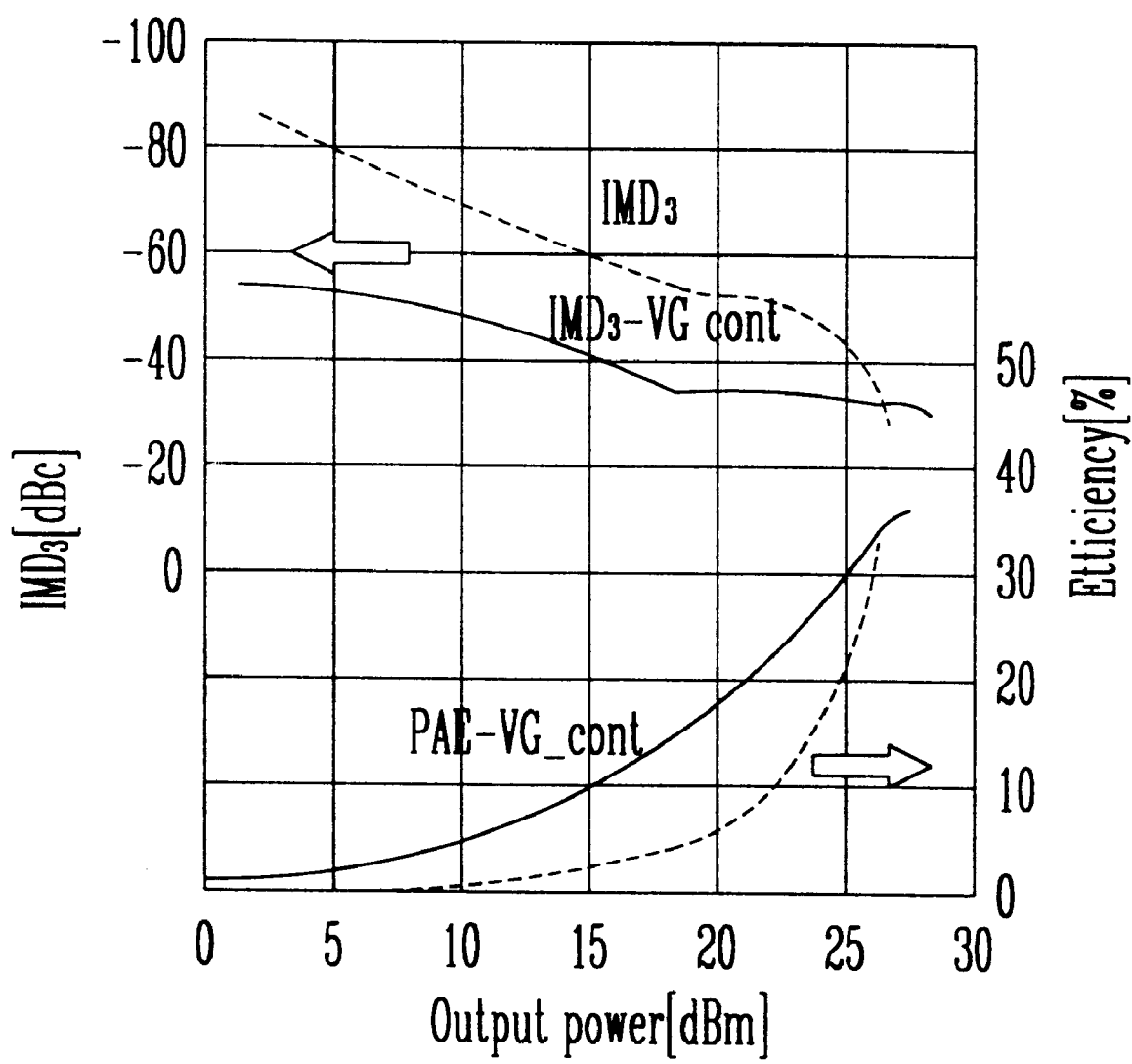
FIG. 5 is a characteristic diagram for showing the improved efficiency and the third order intermodulation distortion of the power amplifier designed by using a gate voltage control circuit of the present invention in comparison with the conventional power amplifier which uses a constant gate voltage applying technique.

FIG. 5 shows the improved characteristics such as the efficiency and the third order intermodulation distortion IMD3 of a power amplifier using a gate voltage control circuit of the present invention.

In an average output power of 16 dBm where the power amplifier largely operates, the conventional power amplifier using the constant gate voltage applying scheme represents 3 percent efficiency, whereas the power amplifier of the present invention has about three times improved efficiency of 10.5% as shown in solid lines in FIG. 5. In addition, the third order intermodulation distortion IMD3 is improved to −33 dBc from the conventional −29 dBc at the maximum output power 27 dBm. Because the power dissipation consumed by the power amplifier is up to half the total power consumption of the mobile telephone, the three times improved efficiency can curtail the power dissipation of the power amplifier to one third, which increases the life time of the battery in the mobile telephone.

As explained so far, with the present invention the gate control voltage is varied in accordance with the magnitude variation of the output power of a power amplifier. Therefore, when the output power is reduced, the gate voltage is also reduced to minimize the output power, and when the output power is increased, the gate voltage is also increased and the linearity of the output power to the input power is improved. Moreover, the present invention enhances the efficiency of the power amplifier particularly in an average output power region, and therefore the battery of a mobile appliance can be used longer.

Numerous alterations and modifications of the structure herein disclosed will present themselves to those skilled in the art. However, it is to be understood that the above described embodiments are for purposes of illustration only and not to be construed as a limitation of the present invention. All such modifications which do not depart from the spirit of the present invention are intended to be included within the scope of the appended claims.

What is claimed is:

1. A gate voltage control circuit comprising:
    an input terminal for receiving an output power signal from a power amplifier;
    an output power detecting circuit for detecting the output power signal and for converting the detected output power signal to a DC voltage signal;
    a voltage dividing circuit haring at least two resistors for dividing a voltage difference between the DC voltage signal and a negative voltage in a ratio of resistances of the resistors; and
    an output terminal for supplying the divided voltage as a gate voltage control signal.

2. The gate voltage control circuit as claimed in claim 1, wherein the gate voltage control signal has a value varying in proportion to a magnitude of the output power signal.

3. The gate voltage control circuit as claimed in claim 1, wherein the output power detecting circuit comprises:
    a first resistor connected to the input terminal;
    a diode having a cathode connected to the first resistor and an anode;
    a capacitor connected between the anode of the diode and a ground terminal for charging the output power signal supplied through the first resistor and the diode; and
    a second resistor connected between the anode of the diode and the ground terminal.

4. The gate voltage control circuit as claimed in claim 3, wherein the voltage dividing circuit comprises a third-resistor connected between the anode of the diode and the output terminal, and a fourth resistor connected between the output terminal and the negative voltage.

5. A power amplifier, comprising:
    a first power amplifying unit for receiving a constant gate voltage from an input matching circuit;
    a gate voltage control circuit for detecting an output power of an output matching circuit and for converting the detected output power to a gate voltage;
    a second power amplifying unit for receiving the gate voltage of the gate voltage control circuit; and
    an intermediate matching circuit for matching the first power amplifying unit and the second power amplifying unit,
    wherein said gate voltage control circuit includes an output power detecting circuit for detecting the output power of the output matching circuit and converting the detected output power to a DC voltage signal, and a voltage dividing circuit for dividing a voltage difference between the DC voltage signal and a negative voltage and for applying the divided voltage as the gate voltage.

6. The gate voltage control circuit of a power amplifier as claimed in claim 5, wherein said output power detecting circuit includes a resistor and a diode which are serially connected between the output matching circuit and a voltage charging circuit, and a capacitor and a resistor which are connected in parallel between the diode and a ground terminal.

* * * * *